United States Patent
Que

(10) Patent No.: US 9,857,655 B2
(45) Date of Patent: Jan. 2, 2018

(54) METHOD FOR CONTROLLING MIS STRUCTURE DESIGN IN TFT AND SYSTEM THEREOF

(71) Applicant: SHENZHEN CHINA STAR OPTOELECTRONICS TECHNOLOGY CO., LTD., Shenzhen (CN)

(72) Inventor: Xiangdeng Que, Shenzhen (CN)

(73) Assignee: SHENZHEN CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 14/416,809

(22) PCT Filed: Dec. 29, 2014

(86) PCT No.: PCT/CN2014/095343
§ 371 (c)(1),
(2) Date: May 9, 2016

(87) PCT Pub. No.: WO2016/061893
PCT Pub. Date: Apr. 28, 2016

(65) Prior Publication Data
US 2016/0252765 A1 Sep. 1, 2016

(30) Foreign Application Priority Data
Oct. 24, 2014 (CN) .......................... 2014 1 0579313

(51) Int. Cl.
*H01L 29/51* (2006.01)
*G02F 1/1368* (2006.01)
(Continued)

(52) U.S. Cl.
CPC ............. *G02F 1/1368* (2013.01); *G09G 3/00* (2013.01); *H01L 21/67253* (2013.01);
(Continued)

(58) Field of Classification Search
CPC . H01L 29/518; H01L 23/53295; G01R 27/26; G02F 2001/136254
See application file for complete search history.

(56) References Cited

U.S. PATENT DOCUMENTS 5,650,361 A * 7/1997 Radhakrishnan ..... C23C 16/303
148/DIG. 113
6,043,167 A * 3/2000 Lee .......................... C23C 16/30
257/E21.264
(Continued)

FOREIGN PATENT DOCUMENTS

| CN | 101017153 A | 8/2007 |
| CN | 101655526 A | 2/2010 |

(Continued)

*Primary Examiner* — Jaehwan Oh
(74) *Attorney, Agent, or Firm* — Buchanan Ingersoll & Rooney PC

(57) ABSTRACT

A method for controlling a MIS structure design in a TFT and a system thereof are disclosed. The method comprises: obtaining dielectric constant of silicon nitride in the MIS structure as designed through calculation; and judging whether the dielectric constant of silicon nitride reaches a set value in a TFT manufacturing procedure, wherein if a negative judgment result is obtained, parameters of the MIS structure are adjusted, so as to enable dielectric constant of silicon nitride in the MIS structure after being adjusted to reach the set value in the TFT manufacturing procedure. A MIS structure design can be effectively controlled, thereby improving performance and stability of TFT-LCD products.

2 Claims, 5 Drawing Sheets

(51) Int. Cl.
　　　*G09G 3/00*　　　　(2006.01)
　　　*H01L 21/67*　　　(2006.01)
　　　*H01L 21/66*　　　(2006.01)
　　　*H01L 27/12*　　　(2006.01)
　　　*H01L 29/49*　　　(2006.01)
　　　*H01L 29/66*　　　(2006.01)
　　　*G02F 1/1362*　　(2006.01)

(52) U.S. Cl.
　　　CPC .......... *H01L 22/20* (2013.01); *H01L 27/1259* (2013.01); *H01L 29/4908* (2013.01); *H01L 29/518* (2013.01); *H01L 29/66181* (2013.01); *G02F 2001/136254* (2013.01); *H01L 22/14* (2013.01)

(56) References Cited

U.S. PATENT DOCUMENTS

| | | | |
|---|---|---|---|
| 7,521,946 B1 | 4/2009 | Janik | |
| 2002/0070731 A1 | 6/2002 | Ohminami | |
| 2002/0195643 A1* | 12/2002 | Harada | H01L 21/76846 257/310 |
| 2005/0134294 A1* | 6/2005 | Ebihara | G01D 5/24 324/662 |
| 2005/0204864 A1* | 9/2005 | Borland | C22C 32/0089 75/252 |
| 2005/0207094 A1* | 9/2005 | Borland | C04B 35/468 361/321.5 |
| 2006/0076963 A1* | 4/2006 | Miyasaka | G06K 9/0002 324/662 |
| 2008/0000304 A1* | 1/2008 | Nagle | A61B 5/1135 73/780 |
| 2008/0248596 A1* | 10/2008 | Das | H01G 4/206 438/3 |
| 2009/0181549 A1* | 7/2009 | Yoneda | C23C 16/40 438/785 |
| 2010/0072581 A1* | 3/2010 | Nakasaki | C07F 7/1836 257/632 |
| 2010/0276753 A1 | 11/2010 | Greene et al. | |
| 2011/0254106 A1* | 10/2011 | Katakami | H01L 21/28185 257/410 |
| 2013/0209754 A1* | 8/2013 | Zhang | C08L 83/04 428/195.1 |
| 2015/0034971 A1* | 2/2015 | Watanabe | H01L 29/66068 257/77 |
| 2015/0035165 A1* | 2/2015 | Chen | H01L 23/481 257/774 |
| 2015/0140696 A1* | 5/2015 | Ahmed | H01L 21/22 438/17 |
| 2016/0049328 A1* | 2/2016 | Zhou | H01L 21/76826 257/751 |
| 2017/0018366 A1* | 1/2017 | Gustafson | H01G 4/30 |

FOREIGN PATENT DOCUMENTS

| | | |
|---|---|---|
| CN | 102110601 A | 6/2011 |
| CN | 102176421 A | 9/2011 |
| CN | 102346232 A | 2/2012 |
| CN | 102439700 A | 5/2012 |
| CN | 102520020 A | 6/2012 |
| TW | 200708748 | 3/2007 |

\* cited by examiner

METHOD FOR CONTROLLING MIS STRUCTURE DESIGN IN TFT AND SYSTEM THEREOF

CROSS-REFERENCE TO RELATED APPLICATIONS

The present application claims benefit of Chinese patent application CN 201410579313.7, entitled "Method for controlling MIS structure design in TFT and system thereof" and filed on Oct. 24, 2014, the entirety of which is incorporated herein by reference.

FIELD OF THE INVENTION

The present disclosure relates to the technical field of liquid crystal displays, and in particular, to a method for controlling MIS structure design in a TFT and a system thereof.

BACKGROUND OF THE INVENTION

Recent years, in a thinning display trend, has witnessed wide use of liquid crystal displays (LCDs for short) in various electronic products, such as mobile phones, laptops, color televisions, etc.

TFT-LCDs are manufactured through an array procedure, a cell procedure, and a module procedure successively. Among all the procedures, the array procedure, similar to a semiconductor procedure, includes forming TFT devices, pixels, and other patterns on a glass substrate according to related requirements.

Different from the semiconductor procedure, during manufacture of TFTs, a metal-insulator-semiconductor (MIS for short) structure substantially uses silicon nitride grown through plasama enhanced chemical vapor deposition (PECVD for short), instead of fine $SiO_2$ grown on a silicon substrate through direct oxidation, as a gate for activating an insulation layer. Hence, the properties of silicon nitride are very important to the characteristics of TFTs.

However, there still lacks an effective method for controlling a MIS structure design in a TFT in the art, and further for determining the MIS structure in the TFT. Therefore, a method is in urgent need to solve the above problems.

SUMMARY OF THE INVENTION

One of the problems to be solved by the present disclosure is to provide a method for controlling a MIS structure design in a TFT. Through this method, a desired MIS structure can be effectively obtained in designing the MIS structure. The present disclosure further provides a system for controlling a MIS structure design in a TFT.

1) The present disclosure provides a method for controlling a MIS structure design in a TFT, comprising: obtaining dielectric constant of silicon nitride in the MIS structure as designed through calculation; and judging whether the dielectric constant of silicon nitride reaches a set value in a TFT manufacturing procedure, wherein if a negative judgment result is obtained, parameters of the MIS structure are adjusted, so as to enable dielectric constant of silicon nitride in the MIS structure after being adjusted to reach the set value in the TFT manufacturing procedure.

2) In one preferred embodiment according to item 1) of the present disclosure, the step of obtaining dielectric constant of silicon nitride in the MIS structure as designed through calculation further comprises: obtaining a capacitance-voltage characteristic curve of the MIS structure through high-frequency capacitance-voltage test; detecting a film thickness value of silicon nitride in the MIS structure; and obtaining the dielectric constant of silicon nitride in the MIS structure through calculation based on a maximum capacitance value in the capacitance-voltage characteristic curve of the MIS structure and the film thickness value of silicon nitride in the MIS structure.

3) In one preferred embodiment according to item 1) or 2) of the present disclosure, the dielectric constant $\varepsilon_i$ of silicon nitride in the MIS structure is obtained through the following formula:

$$\varepsilon_i = \frac{C\max \times di}{A \times \varepsilon_0},$$

wherein C max, di, A, and $\varepsilon_0$ represent the maximum capacitance value of the MIS structure, the film thickness value of silicon nitride in the MIS structure, electrode area, and vacuum dielectric constant, respectively.

4) In one preferred embodiment according to any one of items 1) to 3), the step of obtaining a capacitance-voltage characteristic curve of the MIS structure through high-frequency capacitance-voltage test further comprises: applying a high-frequency voltage signal to the MIS structure, adjusting the high-frequency voltage signal from a first voltage to a second voltage at predetermined voltage intervals so as to obtain a plurality of spaced capacitance-voltage values, and connecting all points representing the spaced capacitance-voltage values to form the capacitance-voltage characteristic curve of the MIS structure.

5) According to another aspect of the present disclosure, a system for controlling a MIS structure design in a TFT is further provided, comprising: a calculating device, which is configured for obtaining dielectric constant of silicon nitride in the MIS structure as designed through calculation; and a judgment device, which is configured for judging whether the dielectric constant of silicon nitride reaches a set value in a TFT manufacturing procedure, wherein if a negative judgment result is obtained, parameters of the MIS structure are adjusted, so as to enable dielectric constant of silicon nitride in the MIS structure after being adjusted to reach the set value in the TFT manufacturing procedure.

6) In one preferred embodiment according to item 5) of the present disclosure, the calculating device further comprises: a high-frequency capacitance-voltage characteristic test device, which is configured for obtaining a capacitance-voltage characteristic curve of the MIS structure through high-frequency capacitance-voltage test; a film thickness gauge, which is configured for detecting a film thickness value of silicon nitride in the MIS structure; and a calculator, which is configured for obtaining the dielectric constant of silicon nitride in the MIS structure through calculation based on a maximum capacitance value in the capacitance-voltage characteristic curve of the MIS structure and the film thickness value of silicon nitride in the MIS structure.

7) In one preferred embodiment according to item 5) or 6) of the present disclosure, the calculator obtains the dielectric constant $\varepsilon_i$ of silicon nitride in the MIS structure through the following formula:

$$\varepsilon_i = \frac{C\max \times di}{A \times \varepsilon_0},$$

wherein C max, di, A, and $\in_0$ represent the maximum capacitance value of the MIS structure, the film thickness value of silicon nitride in the MIS structure, electrode area, and vacuum dielectric constant, respectively.

8) In one preferred embodiment according to any one of items 5) to 7) of the present disclosure, the high-frequency capacitance-voltage characteristic test device comprises: a high-frequency capacitance-voltage characteristic tester, which is configured for applying a high-frequency voltage signal to the MIS structure, adjusting the high-frequency voltage signal from a first voltage to a second voltage at predetermined voltage intervals so as to obtain a plurality of spaced capacitance-voltage values; and an X-Y function recorder, which is coupled to the high-frequency capacitance-voltage characteristic tester and configured for connecting all points representing the plurality of spaced capacitance-voltage values output from the high-frequency capacitance-voltage characteristic tester to form the capacitance-voltage characteristic curve of the MIS structure.

Compared with the prior art, one or more embodiments of the present disclosure has the following advantages.

According to the present disclosure, the characteristics of a dielectric layer in a preliminarily designed MIS structure are tested to obtain dielectric constant of silicon nitride contained therein. Afterwards, it is judged whether the dielectric constant of silicon nitride satisfies the requirements provided in a TFT manufacturing procedure, so that it can be determined whether the currently designed MIS structure is in conformity with a desired structure. Where it is not, parameters of the MIS structure can be adjusted to obtain a desired MIS structure. Hence, a MIS structure design can be effectively controlled according to the present disclosure, thereby improving performance and stability of TFT-LCD products.

Other features and advantages of the present disclosure will be further explained in the following description, and partly become self-evident therefrom, or be understood through implementing the present disclosure. The objectives and advantages of the present disclosure will be achieved through the structure specifically pointed out in the description, claims, and the accompanying drawings.

BRIEF DESCRIPTION OF THE DRAWINGS

The drawings are provided for further understanding of the present disclosure, and constitute one part of the description. They serve to explain the present disclosure in conjunction with the embodiments, rather than to limit the present disclosure in any manner. In the drawings.

DETAILED DESCRIPTION OF THE EMBODIMENTS

In order to present the purpose, technical solution, and advantages of the present disclosure more explicitly, the present disclosure will be further explained in detail in connection with the accompanying drawings.

During a TFT manufacturing procedure, a gate dielectric layer can directly influence reliability of TFT products. And it is generally expected in the manufacturing procedure that silicon nitride of high dielectric constant and minimally subject to ion contaminations can be obtained, and merely minor interfacial defects exist between silicon nitride and a semiconductor layer. As such, TFT products of fine properties and high reliability can be secured. In the embodiments of the present disclosure, the manufacturing procedure can be optimized mainly through testing the dielectric constant of a silicon nitride dielectric layer in a MIS structure as designed. Hence, a desired MIS structure having high dielectric constant of silicon nitride can be obtained.

Embodiment 1

Figure 1:
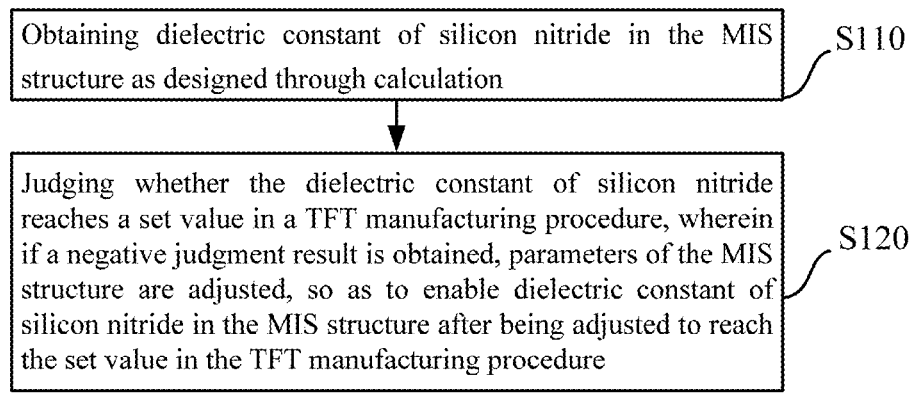
FIG. 1 schematically shows a flow chart of a method for controlling a MIS structure design in a TFT according to an embodiment of the present disclosure.

FIG. 1 schematically shows a flow chart of a method for controlling a MIS structure design in a TFT according to an embodiment of the present disclosure. Reference will be made to FIG. 1 to illustrate the steps of the method.

In step S110, dielectric constant of silicon nitride in the MIS structure as designed is obtained through calculation.

Figure 2:
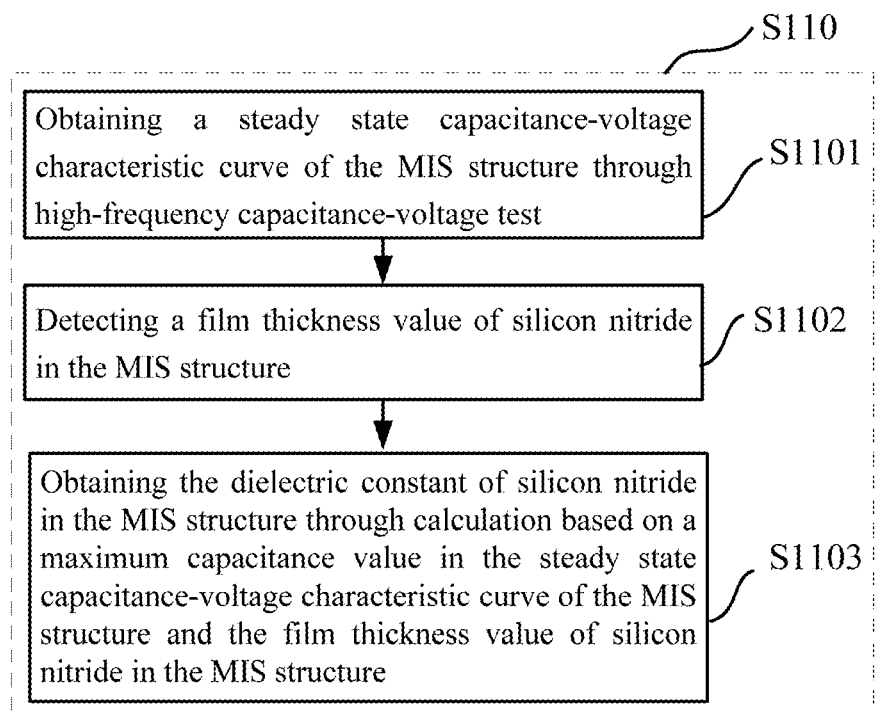
FIG. 2 schematically shows a flow chart of a method for measuring dielectric constant of silicon nitride in a MIS structure according to an embodiment of the present disclosure.

An example will be provided in the following to explain how the dielectric constant of silicon nitride in the MIS structure can be calculated. FIG. 2 schematically shows a flow chart of sub-steps in step S110 according to the first embodiment of the present disclosure.

As indicated in FIG. 2, in sub-step S1101, a steady state capacitance-voltage characteristic curve (a CV curve for short) of a MIS structure to be tested can be first obtained via high-frequency capacitance-voltage test. Specifically, a high-frequency voltage signal can be applied to the MIS structure, and adjusted from a first voltage to a second voltage at predetermined voltage intervals, so as to obtain a plurality of spaced capacitance-voltage values. All points representing the plurality of spaced capacitance-voltage values can be connected to form the steady state capacitance-voltage characteristic curve of the MIS structure.

Next, as shown in sub-step S1102, a film thickness value of silicon nitride in the MIS structure to be tested can be detected. Finally, in sub-step S1103, the dielectric constant of silicon nitride in the MIS structure to be tested can be obtained through calculation based on a maximum capacitance value in the steady state capacitance-voltage characteristic curve of the MIS structure to be tested and the film thickness value of silicon nitride in the MIS structure to be tested.

In sub-step S1103, the dielectric constant $\in_i$ of silicon nitride in the MIS structure is obtained through the following formula:

$$\varepsilon_i = \frac{C\max \times di}{A \times \varepsilon_0},$$

wherein, C max, di, A, and $\in_0$ represent the maximum capacitance value of the MIS structure, the film thickness value of silicon nitride in the MIS structure, electrode area, and vacuum dielectric constant, respectively.

In step S120, it is judged whether the dielectric constant of silicon nitride reaches a set value in a TFT manufacturing procedure. If a negative judgment result is obtained, parameters of the MIS structure are adjusted, so as to enable dielectric constant of silicon nitride in the MIS structure after being adjusted to reach the set value in the TFT manufacturing procedure.

The inventor of the present disclosure has acquired the following knowledge through numerous studies.

Figure 3:
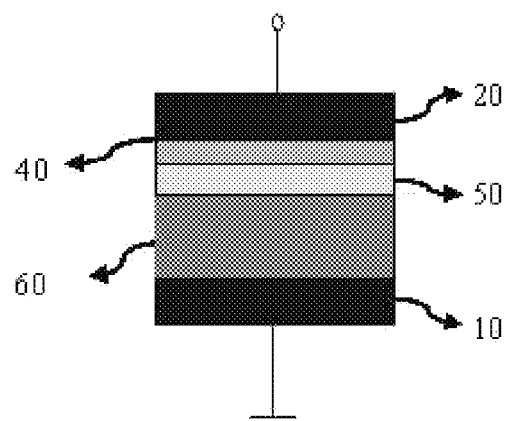
FIG. 3 schematically shows a MIS structure.
Figure 4:
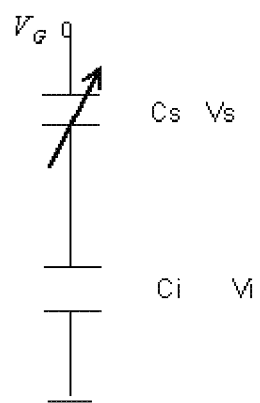
FIG. 4 is an equivalent circuit diagram of a MIS structure.

A MIS structure is similar to a plate capacitor formed by metal and dielectric, as shown in FIG. 3. However, since charge density in a semiconductor can be much smaller than in a metal, a space charge region formed by electric charges has a certain thickness (generally in the order of micron) on a surface of the semiconductor (an amorphous silicon 50 as shown in the figure), whereas it merely forms a thin film (approximately 0.1 nm) on a surface of the metal. FIG. 4 is an equivalent circuit diagram of a MIS structure. The thickness of the space charge region on the surface of the semiconductor varies with a bias voltage $V_G$. Therefore, a MIS capacitor is a differential one, specifically as shown in formula (1):

$$C = A \frac{dQ_G}{dV_G}, \tag{1}$$

wherein $Q_G$ represents surface charge density on a metal electrode, and A represents electrode area.

It is necessary for an ideal MIS structure to satisfy the following requirements: (a) a work function difference between the metal and the semiconductor should be zero (i.e., ideal ohmic contact is achieved by a N+ layer 40 in the figure); (b) a gate silicon nitride insulation layer (hereinafter referred to as the $SiN_x$ insulation layer or $SiN_x$) 60 has no charge thereon; and (3) an interface state does not exist at an interface between the $SiN_x$ insulation layer 60 and the semiconductor. The bias voltage $V_G$ partly acts on $SiN_x$, referred to as $V_i$ and partly in the space charge region on the surface of the semiconductor, referred to as $V_s$. That is, $V_G$ satisfies formula (2) as follows:

$$V_G = V_i + V_s, \tag{2}$$

wherein Vs can also be termed as surface potential.

Since the charges in the space charge region on the surface of the semiconductor and those on the metal electrode are of the same quantity but opposite electric properties, formula (3) as follows exists:

$$|Q_{SC}| = |Q_G| \tag{3}$$

wherein $Q_{SC}$ represents the electric charge surface density in the space charge region on the surface of the semiconductor.

Therefore, when formulae (2) and (3) are substituted into formula (1), formula (4) can be obtained:

$$C = A \frac{dQ_G}{dV_G} = A \frac{dQ_G}{dV_i + dV_S} = \frac{1}{\frac{1}{C_i} + \frac{1}{C_S}} = \frac{C_i C_S}{C_i + C_S} \tag{4}$$

Formula (4) above indicates that the MIS capacitor is formed by capacitors $C_i$ and Cs in series connection with each other, and has an equivalent circuit as shown in FIG. 4. $C_i$ represents the capacitor of a silicon nitride layer with $SiN_x$ as a dielectric, and the value thereof would not vary with $V_G$, while $C_s$ indicates the capacitor of a space region on the surface of the semiconductor (the amorphous silicon 50), and the value thereof would vary with $V_G$. Therefore:

$$C_i = A \left| \frac{dQ_G}{dV_i} \right| = A \frac{\varepsilon_0 \varepsilon_i}{d_i}, \tag{5}$$

$$C_S = A \left| \frac{dQ_{SC}}{dV_S} \right|, \tag{6}$$

In formulae (5) and (6), $\in_i$, $d_i$ and $\in_0$ represent a relative dielectric constant of $SiN_x$, thickness of a dielectric layer of $SiN_x$, and vacuum dielectric constant, respectively. From formulae (4) and (5), it can be derived that the maximum capacitance of the MIS structure is as follows:

$$C_{max} \approx C_i = A \frac{\varepsilon_0 \varepsilon_i}{d_i}. \tag{7}$$

Therefore, the dielectric constant of silicon nitride in the MIS structure can be calculated through:

$$\varepsilon_i = \frac{C\max \times di}{A \times \varepsilon_0}.$$

In order to further explain the method of the present disclosure, an example will be provided in the following.

Example

Figure 5:
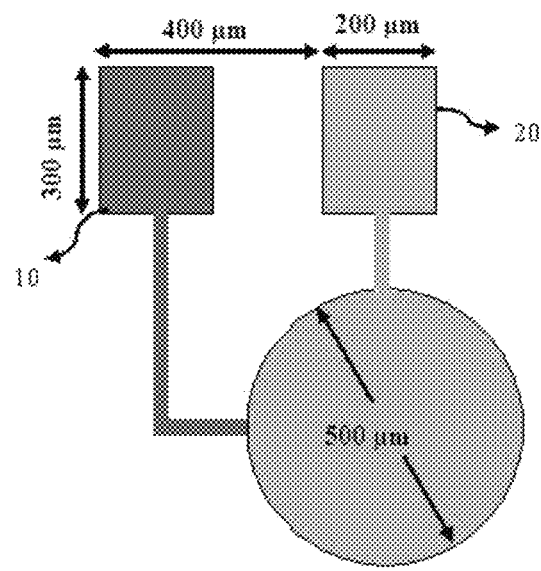
FIG. 5 shows an example graph of a preliminarily designed MIS capacitor.
Figure 6:
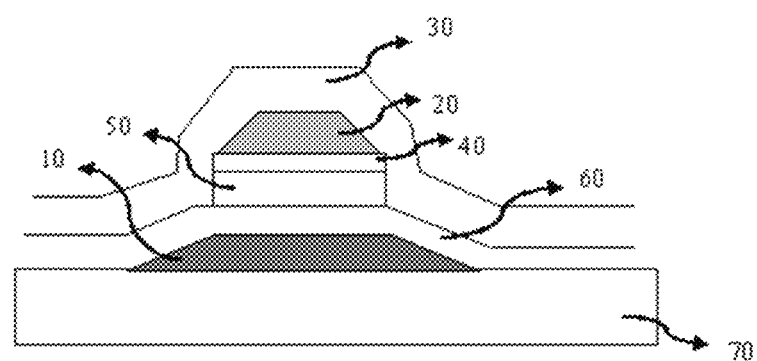
FIG. 6 schematically shows a cross section of the MIS capacitor as shown in FIG. 5.

It can be supposed that the design structure of a MIS capacitor is shown in FIG. 5, with a cross section shown in FIG. 6.

FIG. 5 is a top view of the structure designed for a product according to the present disclosure, which forms a circle with a diameter of 500 μm. It can be readily understood that the size of the diameter should not be construed as a limitation, but merely as an example. Those skilled in the art can choose any size as required. The circular cross section shown in FIG. 6 comprises, from the bottom up, a glass substrate 70 as a base, a first layer of metal (gate metal layer) 10, a gate silicon nitride insulation layer 60, a semiconductor amorphous layer 50, a N+ layer 40, a second layer of metal (source metal layer) 20, and a silicon nitride passivation protective layer 30.

The first layer of metal (gate metal layer) 10, the semiconductor amorphous layer 50, the N+ layer 40, and the second layer of metal (source metal layer) 20 form the circular pattern as shown in FIG. 5. Moreover, the first layer of metal 10 and the second layer of metal 20 each lead to a rectangular pad having a size of 200 μm*300 μm, for contacting a test pin during a test procedure. The thickness of each of the above layers is determined by the TFT manufacturing procedure and is generated therewith. Absolutely, the above sizes are just examples, non-exclusive of other designs of sizes.

The above pads in contact with the two layers of metal are applied with a high-frequency voltage signal of 1 MHz, which is adjusted from −20 V to 20 V. A set of capacitance-voltage values is recorded at intervals of 50 mV or 100 mV at room temperature, so that a corresponding CV curve is obtained. A maximum valve of the capacitance C of the MIS structure can then be obtained according to the CV curve. As can be conceived from formula (7), this maximum value of capacitance is approximately equal to the capacitance of silicon nitride in the MIS structure.

Meanwhile, a film thickness value of silicon nitride can be measured with a film thickness gauge or a scanning electron microscope (SEM for short) during the manufacturing procedure. The dielectric constant of silicon nitride in the MIS structure to be tested can be calculated according to the relationship between the film thickness value, electrode area, vacuum dielectric constant and the capacitance. A higher value of dielectric constant indicates more remarkable insulating properties of silicon nitride.

Finally, it is judged whether the dielectric constant of silicon nitride in the MIS structure obtained reaches a set value in the manufacturing procedure. If not, the MIS structure currently designed does not satisfy the requirements yet, and parameters thereof therefore need to be further adjusted.

In addition, the MIS structure that has been designed can also be tested for performance thereof. Specifically, a first C-V curve of the MIS structure can be obtained at the outset. Next, the MIS structure is first biased at a certain temperature and then recovered. A second C-V curve of the recovered MIS structure can be further obtained, and compared with the first C-V curve. A lower voltage shift of the second C-V curve from the first C-V curve would indicate better performance of silicon nitride and higher reliability of the TFT.

According to the present disclosure, the characteristics of a dielectric layer in a preliminarily designed MIS structure are tested to obtain dielectric constant of silicon nitride contained therein. Afterwards, it is judged whether the dielectric constant of silicon nitride satisfies the requirements provided in a TFT manufacturing procedure, so that it can be determined whether the currently designed MIS structure is in conformity with a desired structure. Where it is not, parameters of the MIS structure can be adjusted to obtain a desired MIS structure. Hence, a MIS structure design can be effectively controlled according to the present disclosure, thereby improving performance and stability of TFT-LCD products.

Embodiment 2

Figure 7:
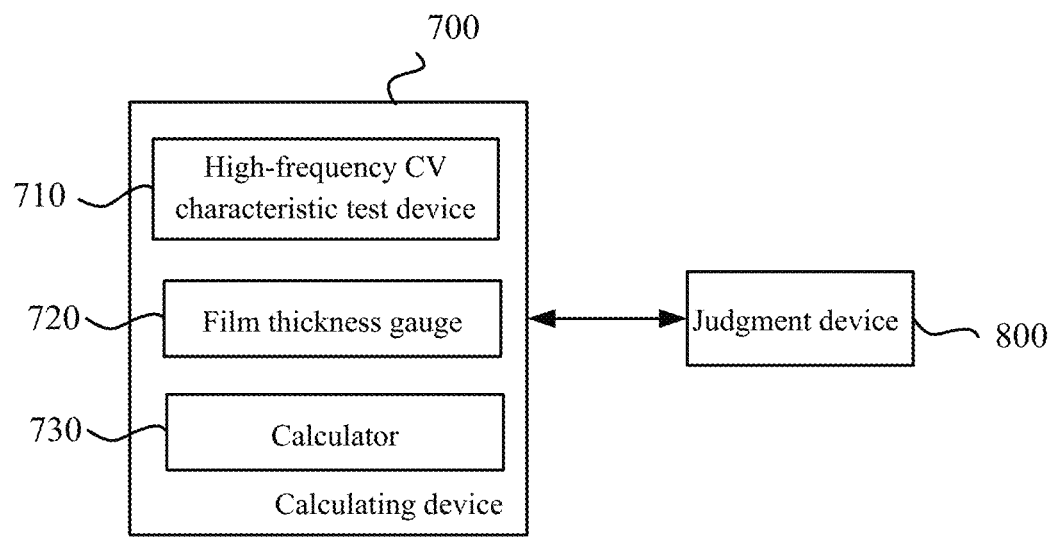
FIG. 7 schematically shows the structure of a system for controlling a MIS structure design in a TFT according to an embodiment of the present disclosure.

FIG. 7 schematically shows the structure of a system for controlling a MIS structure design in a TFT according to an embodiment of the present disclosure. Reference will be made to FIG. 7 to illustrate the structure and the function of the system according to the present disclosure in detail.

As FIG. 7 shows, the system comprises a calculating device 700 and a judgment device 800 coupled thereto.

The calculating device 700 is configured for obtaining dielectric constant of silicon nitride in the MIS structure as designed through calculation.

The judgment device 800 is configured for judging whether the dielectric constant of silicon nitride reaches a set value in a TFT manufacturing procedure, wherein if a negative judgment result is obtained, parameters of the MIS structure are adjusted, so as to enable dielectric constant of silicon nitride in the MIS structure after being adjusted to reach the set value in the TFT manufacturing procedure.

The calculating device 700 further comprises a high-frequency capacitance-voltage characteristic test device (high-frequency CV test device for short) 710, which is configured for obtaining a steady state capacitance-voltage characteristic curve of the MIS structure through high-frequency capacitance-voltage test.

Figure 8:
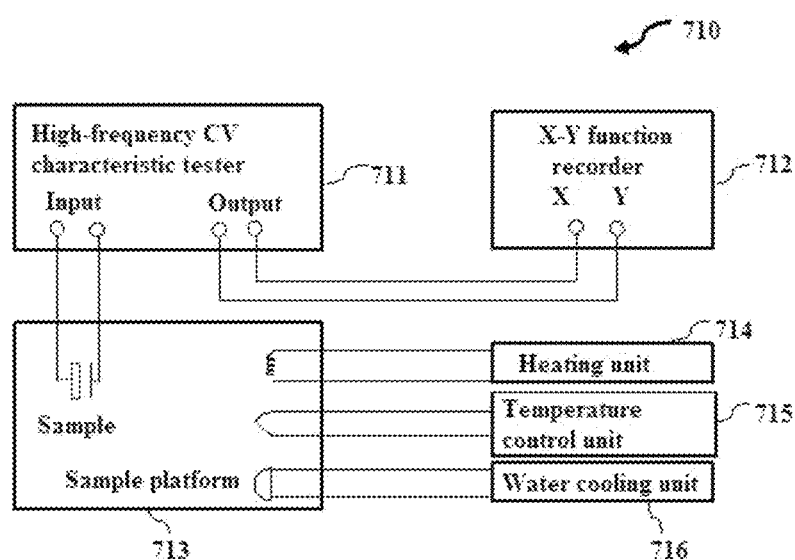
FIG. 8 schematically shows the structure of a high-frequency capacitance-voltage characteristic test device 710.

FIG. 8 schematically shows the structure of the high-frequency capacitance-voltage characteristic test device 710. As shown in FIG. 8, the high-frequency capacitance-voltage characteristic test device 710 comprises a high-frequency capacitance-voltage characteristic tester (high-frequency CV tester as shown in the FIG. 711, which is configured for applying a high-frequency voltage signal to the MIS structure (marked as "sample" in the figure) provided on a sample platform 713, and adjusting the high-frequency voltage signal from a first voltage to a second voltage at predetermined voltage intervals, so as to obtain a plurality of spaced capacitance-voltage values.

An X-Y function recorder 712 is coupled to the high-frequency capacitance-voltage characteristic tester 711, and configured for connecting all points representing the plurality of spaced capacitance-voltage values output from the high-frequency capacitance-voltage characteristic tester 711 to form the steady state capacitance-voltage characteristic curve of the MIS structure.

In addition, the high-frequency capacitance-voltage characteristic test device 710 further comprises a heating unit 714, a temperature control unit 715, and a water cooling unit 716. These units can be arranged for testing performance of the MIS structure that has been designed. Specifically, a first C-V (a steady-state capacitance-voltage characteristic curve) curve of the MIS structure can be obtained at the outset. Next, the MIS structure is first biased at a certain temperature and then recovered. A second C-V curve (a steady-state capacitance-voltage characteristic curve) of the recovered MIS structure can be further obtained, and compared with the first C-V curve. A lower voltage shift of the second C-V curve from the first C-V curve would indicate better performance of silicon nitride and higher reliability of the TFT.

A film thickness gauge 720 is configured for detecting a film thickness value of silicon nitride in the MIS structure.

A calculator 730 is configured for obtaining the dielectric constant of silicon nitride in the MIS structure through calculation based on a maximum capacitance value in the capacitance-voltage characteristic curve of the MIS structure and the film thickness value of silicon nitride in the MIS structure.

Specifically, the calculator 730 obtains the dielectric constant $\varepsilon_i$ of silicon nitride in the MIS structure through the following formula:

$$\varepsilon_i = \frac{C\max \times di}{A \times \varepsilon_0}.$$

In the above formula, C max, di, A, and $\varepsilon_0$ represent the maximum capacitance value of the MIS structure, the film thickness value of silicon nitride in the MIS structure, electrode area, and vacuum dielectric constant, respectively.

The high-frequency capacitance-voltage characteristic test device 710 can be used for test through the following steps.

To start with, the high-frequency CV characteristic tester 711 and the X-Y function recorder 712 can both be turned on and preheated for 10 min. A zero point and a measurement range of the X-Y function recorder 712 can then be determined. In addition, a corresponding capacitance measurement range of the high-frequency CV characteristic tester 711 can be selected according to a maximum capacitance value of a sample to be tested, which can be estimated based on a known electrode area and thickness of an oxidation layer. The capacitance measurement range that has been selected should be corrected. The high-frequency CV characteristic tester 711 can output capacitance values according to a minority carrier lifetime of the sample. The X-Y function recorder 712 can determine a bias voltage CV curve based on the output values. The bias voltage CV curve at this moment, however, is not the one as required. Subsequently, a high-frequency voltage signal of 1 MHz can be used for test at a preliminarily selected rate of 100 mV per second. If a deep depletion curve is still to be obtained, the rate should be reduced until a steady state CV curve is obtained.

The calculator 730 can obtain a maximum value of capacitance Cmax at room temperature according to the steady state CV curve.

The film thickness gauge 720 or the scanning electron microscope can be used to obtain a film thickness value of silicon nitride through measurement. The calculator 730 can finally obtain the dielectric constant of silicon nitride through calculation based on the maximum capacitance value and the film thickness value of silicon nitride.

Figure 9:
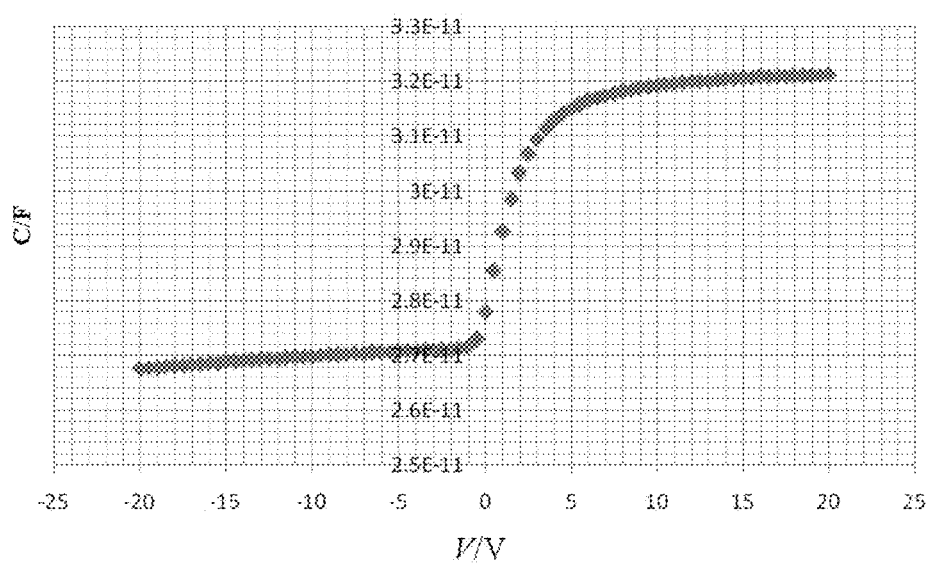
FIG. 9 shows a CV curve graph obtained through test using the high-frequency capacitance-voltage characteristic test device 710.

The high-frequency CV characteristic tester 711 and the X-Y function recorder 712 were used to test a product design and the CV curve obtained thereof is shown in FIG. 9, with Cmax=3.212E−11F, A=$\pi r^2$=3.14×(258×10$^{-6}$)$^2$=2.09×10$^{-7}$ (m$^2$), and $\epsilon_0$=8.85×10$^{-12}$ F/m.

SEM and nanotechnology were used and the film thickness value of silicon nitride was tested to be: di=3562A=3.562×10$^{-7}$ m.

Therefore, $$\varepsilon_i = \frac{C\max \times di}{A \times \varepsilon_0} = \frac{3.212 \times 10^{-11} \times 3.562 \times 10^{-7}}{2.09 \times 10^7 \times 8.85 \times 10^{-12}} = 6.18.$$

At this moment, the dielectric constant of gate silicon nitride is 6.18, which is relatively high within a set range from 5.8 to 6.3. Therefore, this product can be batch produced as a final product.

According to the present disclosure, the characteristics of a dielectric layer in a preliminarily designed MIS structure are tested to obtain dielectric constant of silicon nitride contained therein. Afterwards, it is judged whether the dielectric constant of silicon nitride satisfies the requirements provided in a TFT manufacturing procedure, so that it can be determined whether the currently designed MIS structure is in conformity with a desired structure. Where it is not, parameters of the MIS structure can be adjusted to obtain a desired MIS structure. Hence, a MIS structure design can be effectively controlled according to the present disclosure, thereby improving performance and stability of TFT-LCD products.

The above description should not be construed as limitations of the present disclosure, but merely as exemplifications of preferred embodiments thereof. Any variations or replacements that can be readily envisioned by those skilled in the art are intended to be within the scope of the present disclosure. Hence, the scope of the present disclosure should be subject to the scope defined in the claims.

The invention claimed is:

1. A method for controlling a MIS structure design in a TFT, comprising:

obtaining dielectric constant of silicon nitride in the MIS structure as designed through calculation; and judging whether the dielectric constant of silicon nitride reaches a set value in a TFT manufacturing procedure, wherein if a negative judgment result is obtained, parameters of the MIS structure are adjusted, so as to enable dielectric constant of silicon nitride in the MIS structure after being adjusted to reach the set value in the TFT manufacturing procedure;

wherein the step of obtaining dielectric constant of silicon nitride in the MIS structure as designed through calculation further comprises:;

obtaining a capacitance-voltage characteristic curve of the MIS structure through high-frequency capacitance-voltage test;

detecting a film thickness value of silicon nitride in the MIS structure; and obtaining the dielectric constant of silicon nitride in the MIS structure through calculation based on a maximum capacitance value in the capacitance-voltage characteristic curve of the MIS structure and the film thickness value of silicon nitride in the MIS structure;

wherein the dielectric constact $\epsilon_i$ of silicon nitride in the MIS structure is obtained through the following formula:

$$\varepsilon_i = \frac{C\max \times di}{A \times \varepsilon_0},$$

wherein C max, di, A, and $\epsilon$ represent the maximum capacitance value of the MIS structure, the film thickness value of silicon nitride in the MIS structure, electrode area, and vacuum dielectric constant, respectively.

2. The method accoridng to claim 1, wherein the step of obtaining a capacitance-voltage characteristic curve of the MIS structure through high-frequency capacitance-voltage test further comprises:

applying a high-frequency voltage signal to the MIS structure, adjusting the high-frequency voltage signal from a first voltage to a second voltage at predetermined voltage intervals so as to obtain a plurality of spaced capacitance-voltage values, and connecting all points representing the spaced capacitance-voltage values to form the capacitance-voltage characteristic curve of the MIS structure.

* * * * *